(12) United States Patent
Mun et al.

(10) Patent No.: US 11,996,155 B2
(45) Date of Patent: May 28, 2024

(54) MEMORY DEVICE AND METHOD OF OPERATING THE SAME

(71) Applicant: SK hynix Inc., Icheon-si (KR)

(72) Inventors: Yeong Jo Mun, Icheon-si (KR); Dong Hun Kwak, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 202 days.

(21) Appl. No.: 17/589,396

(22) Filed: Jan. 31, 2022

(65) Prior Publication Data

US 2023/0062706 A1 Mar. 2, 2023

(30) Foreign Application Priority Data

Aug. 27, 2021 (KR) ........................ 10-2021-0114203

(51) Int. Cl.
 *G11C 16/00* (2006.01)
 *G11C 16/04* (2006.01)
 *G11C 16/08* (2006.01)
 *G11C 16/10* (2006.01)
 (Continued)

(52) U.S. Cl.
 CPC ...... *G11C 16/3459* (2013.01); *G11C 16/0483* (2013.01); *G11C 16/08* (2013.01); *G11C 16/10* (2013.01); *G11C 16/24* (2013.01)

(58) Field of Classification Search
 CPC . G11C 16/24; G11C 16/0483; G11C 11/5628; G11C 16/10; G11C 16/3459; G11C 16/32; G11C 16/26; G11C 16/08; G11C 16/3404; G11C 16/102; G11C 16/14; G11C 16/34; G11C 11/56; G11C 11/4074; G11C 11/4076; G11C 11/4091; G11C 11/4093; G11C 11/4094; G11C 16/3427; G11C 2211/5621; G11C 2211/5642; G11C 2211/5644; G11C 7/1084; G11C 7/12; G11C 11/5642; G11C 11/5671; G11C 16/30; G11C 16/3418; G11C 16/3454; G11C 7/065
 USPC .... 365/185.22, 203, 185.03, 185.17, 185.18, 365/185.24, 185.29, 185.33, 189.05
 See application file for complete search history.

(56) References Cited

U.S. PATENT DOCUMENTS 11,742,035 B2 * 8/2023 Choi ..................... G11C 16/26
 365/185.22

FOREIGN PATENT DOCUMENTS

KR 1020100099884 A 9/2010
KR 1020200118713 A 10/2020

* cited by examiner

*Primary Examiner* — Thong Q Le
(74) *Attorney, Agent, or Firm* — WILLIAM PARK & ASSOCIATES LTD.

(57) ABSTRACT

A memory device and method of operation includes memory cells and a program operation performer configured to perform a verify operation and a program voltage apply operation, wherein the verify operation verifies whether threshold voltages of the memory cells have reached threshold voltages corresponding to a target program state using a first verify voltage, a second verify voltage higher than the first verify voltage and a third verify voltage higher than the second verify voltage, and the program voltage apply operation applies a program voltage to a word line. The memory device and method of operation also includes a program operation controller configured to control the program operation performer such that, during the program voltage apply operation, a precharge voltage is first applied to a second bit line coupled to a second memory cell before a precharge voltage is applied to a first bit line.

20 Claims, 15 Drawing Sheets

(51) Int. Cl.
*G11C 16/24* (2006.01)
*G11C 16/34* (2006.01)

MEMORY DEVICE AND METHOD OF OPERATING THE SAME

CROSS-REFERENCE TO RELATED APPLICATION

The present application claims priority under 35 U.S.C. § 119(a) to Korean patent application number 10-2021-0114203, filed on Aug. 27, 2021, in the Korean Intellectual Property Office, the entire disclosure of which is incorporated herein by reference.

BACKGROUND

1. Technical Field

Various embodiments of the present disclosure relate to an electronic device, and more particularly to a memory device and a method of operating the memory device.

2. Related Art

Memory devices are storage devices implemented using a semiconductor such as silicon (Si), germanium (Ge), gallium arsenide (GaAs), or indium phosphide (InP). Memory devices are generally classified as volatile memory devices or nonvolatile memory devices.

A volatile memory device is a memory device in which stored data is lost when supplied power is interrupted. Representative examples of a volatile memory device include memory devices using static random access memory (SRAM), dynamic RAM (DRAM), and synchronous DRAM (SDRAM). A nonvolatile memory device is a memory device in which stored data is retained even when supplied power is interrupted. Representative examples of a nonvolatile memory device include memory devices using read only memory (ROM), programmable ROM (PROM), electrically programmable ROM (EPROM), electrically erasable programmable ROM (EEPROM), flash memory, phase-change RAM (PRAM), magnetic RAM (MRAM), resistive RAM (RRAM), and ferroelectric RAM (FRAM). Flash memory is generally classified as NOR type or NAND type.

SUMMARY

Various embodiments of the present disclosure are directed to a memory device that is capable of mitigating or preventing a coupling phenomenon between adjacent bit lines that occurs in a program operation, and to a method of operating the memory device.

An embodiment of the present disclosure may provide for a memory device. The memory device may include memory cells, a program operation performer configured to perform a verify operation and a program voltage apply operation, wherein the verify operation is performed to verify whether threshold voltages of the memory cells have reached threshold voltages corresponding to a target program state using a first verify voltage, a second verify voltage higher than the first verify voltage and a third verify voltage higher than the second verify voltage and wherein the program voltage apply operation is performed to apply a program voltage to a word line coupled in common to the memory cells based on a result of the verify operation, and a program operation controller configured to control the program operation performer such that, during the program voltage apply operation, a precharge voltage is first applied to a second bit line coupled to a second memory cell having a threshold voltage that is higher than the second verify voltage and lower than or equal to a third verify voltage, among the memory cells, before a precharge voltage is applied to a first bit line coupled to a first memory cell having a threshold voltage that is higher than the first verify voltage and lower than or equal to the second verify voltage, among the memory cells.

An embodiment of the present disclosure may provide for a method of operating a memory device, the memory device performing a program operation of storing data in memory cells. The method may include applying at least three verify voltages to a word line coupled in common to the memory cells, applying a precharge voltage to bit lines respectively coupled to the memory cells at different time points depending on threshold voltages of the memory cells identified using the at least three verify voltages, and applying a program voltage to the word line after the precharge voltage is applied.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Figure 1:
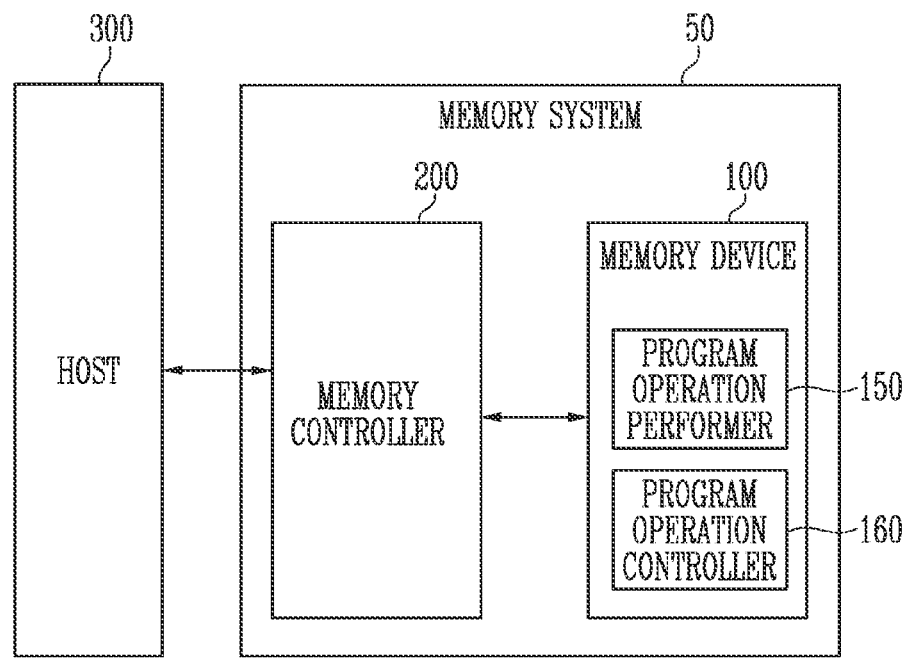
FIG. 1 is a diagram illustrating a memory system including a memory device according to an embodiment of the present disclosure.

FIG. 1 is a diagram illustrating a memory system including a memory device according to an embodiment of the present disclosure.

Referring to FIG. 1, a memory system 50 may include a memory device 100 and a memory controller 200. The memory system 50 may be a device which stores data under the control of a host 300, such as a mobile phone, a smartphone, an MP3 player, a laptop computer, a desktop computer, a game console, a TV, a tablet PC, or an in-vehicle infotainment system.

The memory system 50 may be manufactured as any one of various types of storage devices depending on a host interface that is a scheme for communication with the host 300. For example, the memory system 50 may be implemented as any one of various types of storage devices, for example: a solid state disk (SSD); a multimedia card such as an MMC, an embedded MMC (eMMC), a reduced size MMC (RS-MMC), or a micro-MMC; a secure digital card such as an SD, a mini-SD, or a micro-SD; a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The memory system 50 may be manufactured in any one of various types of package forms. For example, the memory system 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 may be operated in response to the control of the memory controller 200. The memory device 100 may include a memory cell array (not illustrated) including a plurality of memory cells which store data.

Each of the memory cells may be implemented as a single-level cell (SLC) capable of storing one bit of data, a multi-level cell (MLC) capable of storing two bits of data, a triple-level cell (TLC) capable of storing three bits of data, or a quad-level cell (QLC) capable of storing four bits of data.

The memory cell array (not illustrated) may include a plurality of memory blocks, Each memory block may include a plurality of memory cells. A single memory block may include a plurality of pages. In an embodiment, a page may be a unit by which data is stored in the F, memory device 100 or by which data stored in the memory device 100 is read. A memory block may be a unit by which data is erased.

In an embodiment, the memory device 100 may be implemented using double data rate synchronous dynamic random access memory (DDR SDRAM), low power double data rate fourth generation (LPDDR4) SDRAM, graphics double data rate (DDDR) SDRAM, low power DDR (LPDDR) SDRAM, Rambus dynamic random access memory (RDRAM), NAND flash memory, vertical NAND flash memory, NOR flash memory device, resistive RAM (RRAM), phase-change RAM (PRAM), magnetoresistive RAM (MRAM), ferroelectric RAM (FRAM), or spin transfer torque RAM (SST-RAM). In the present specification, for convenience of description, a description is made on the assumption that the memory device 100 uses NAND flash memory.

The memory device 100 may receive a command and an address from the memory controller 200, and may access the area of the memory cell array, selected by the address. The memory device 100 may perform an operation indicated by the command on the area selected by the address. For example, the memory device 100 may perform a write operation (i.e., a program operation), a read operation, and an erase operation, During a write operation, the memory device 100 may program data to the area selected by the address, During a read operation, the memory device 100 may read data from the area selected by the address. During an erase operation, the memory device 100 may erase data stored in the area selected by the address.

In an embodiment, the memory device 100 may include a program operation performer 150 and a program operation controller 160.

The program operation performer 150 may perform a program operation on memory cells. The program operation may be an operation of storing data in the memory cells. In detail, the program operation may be an operation of increasing the threshold voltages of memory cells depending on the data to be stored in the memory cells. When the program operation is performed, each of the memory cells may have a threshold voltage corresponding to any one of a plurality of program states. The plurality of program states may be designated depending on the number of data bits stored in one memory cell. For example, when data is programmed in a triple-level cell (TLC) scheme in which three bits of data are stored in one memory cell, the plurality of program states may indicate an erased state and first to seventh program states. After the program operation has been performed, threshold voltages of the memory cells may be determined depending on data to be stored in the memory cells. Each of the memory cells may have any one of the plurality of program states as a target program state depending on the data to be stored in the corresponding memory cell.

In an embodiment, a program operation may include a program voltage apply operation and a verify operation. The program voltage apply operation may be an operation of applying a program voltage to a word line coupled in common to the memory cells. The verify operation may be an operation of verifying whether the threshold voltage of each memory cell has reached a threshold voltage corresponding to the target program state. In an embodiment, the verify operation may be an operation of applying at least three verify voltages to the word line coupled to the memory cells.

The program operation controller 160 may control the program operation performer 150 during a program operation. In an embodiment, the program operation controller 160 may control the program operation performer 150 so that the program voltage is applied to the word line coupled in common to the memory cells during the program voltage apply operation. In an embodiment, the program operation controller 160 may control the program operation performer 150 so that at least three verify voltages are applied to the word line coupled to the memory cells during the verify operation.

The operation of the program operation performer 150 and the program operation controller 160 according to the embodiment of the present disclosure will be described in detail later with reference to FIG. 7.

The memory controller 200 may control the overall operation of the memory system 50.

When power is applied to the memory system 50, the memory controller 200 may run firmware (FW). When the memory device 100 is a flash memory device, the firmware (FW) may include a host interface layer (HIL) which controls communication with the host 300, a flash translation layer (FTL) which controls communication between the host 300 and the memory device 100, and a flash interface layer (FIL) which controls communication with the memory device 100.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored. In the present specification, the terms "logical block address (LBA)" and "logical address" may be used interchangeably. In the present specification, the terms "physical block address (PBA)" and "physical address" may be used interchangeably.

The memory controller 200 may control the memory device 100 so that a write operation, a read operation, or an erase operation is performed in response to a request received from the host 300, During a write operation, the memory controller 200 may provide a write command, a physical block address, and data to the memory device 100. During a read operation, the memory controller 200 may provide a read command and a physical block address to the memory device 100. During an erase operation, the memory controller 200 may provide an erase command and a physical block address to the memory device 100.

In an embodiment, the memory controller 200 may autonomously generate a command, an address, and data regardless of whether a request from the host 300 is received, and may transmit them to the memory device 100. For example, the memory controller 200 may provide the memory device 100 with commands, addresses, and data used in order to perform read operations and write operations that are involved in performing wear leveling, read reclaim, garbage collection, etc.

In an embodiment, the memory controller 200 may control at least two memory devices 100. In this case, the memory controller 200 may control the memory devices 100 depending on an interleaving scheme to improve operating performance. The interleaving scheme may be a scheme for controlling the memory devices 100 so that the operations of at least two memory devices 100 are caused to overlap each other.

The host 300 may communicate with the memory system 50 using at least one of various communication methods such as universal serial bus (USB), Serial AT Attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
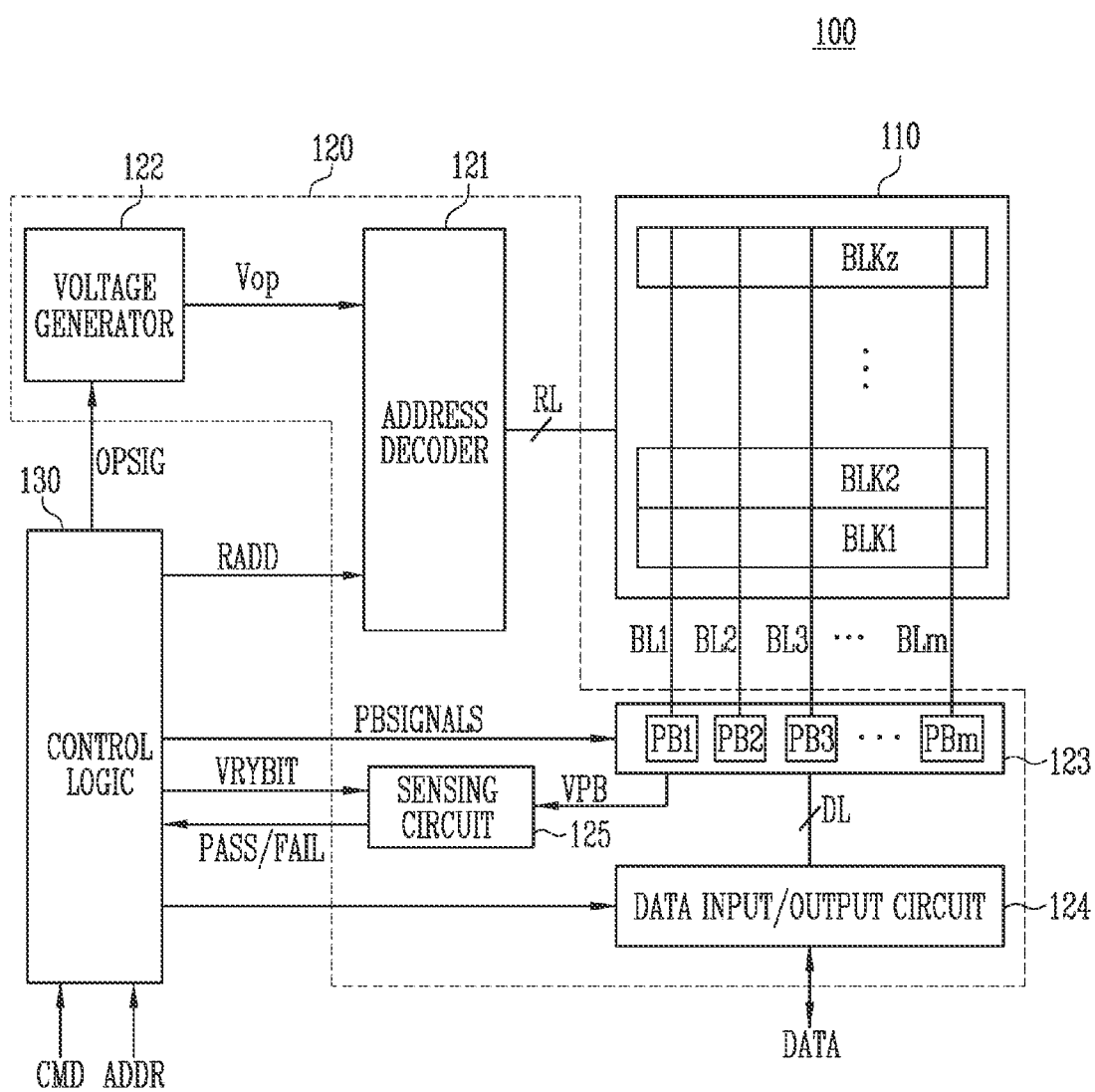
FIG. 2 is a diagram illustrating the structure of the memory device of FIG. 1.

FIG. 2 is a diagram illustrating the structure of the memory device 100 of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz may F, be coupled to an address decoder 121 through row lines RL. The memory blocks BLK1 to BLKz are coupled to a page buffer group 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. In other words, the memory cell array 110 may include a plurality of pages. In an embodiment of the present disclosure, each of the memory blocks BLK1 to BLKz included in the memory cell array 110 may include a plurality of dummy cells. For the dummy cells, one or more dummy cells may be coupled in series between a drain select transistor and memory cells and between a source select transistor and the memory cells.

Each of the memory cells of the memory device 100 may be implemented as a single-level cell (SLC) capable of storing one bit of data, a multi-level cell (MLC) capable of storing two bits of data, a triple-level cell (TLC) capable of storing three bits of data, or a quad-level cell (QLC) capable of storing four bits of data.

The peripheral circuit 120 may drive the memory cell array 110. In an example, the peripheral circuit 120 may drive the memory cell array 110 so that a program operation, a read operation, and an erase operation are performed under the control of the control logic 130. In other examples, the peripheral circuit 120 may apply various operating voltages to the row lines RL and the bit lines BL1 to BLm or discharge the applied voltages under the control of the control logic 130.

The peripheral circuit 120 may include the address decoder 121, a voltage generator 122, the page buffer group 123, a data input/output circuit 124, and a sensing circuit 125.

The address decoder 121 is coupled to the memory cell array 110 through the row lines RL. The row lines RL may include drain select lines, word lines, source selection lines, and a common source line. In accordance with an embodiment of the present disclosure, the word lines may include normal word lines and dummy word lines. In accordance with an embodiment, the row lines RL may further include a pipe select line.

The address decoder 121 may be operated under the control of the control logic 130, The address decoder 121 receives addresses ADDR from the control logic 130.

The address decoder 121 may decode a block address, among the received addresses ADDR. The address decoder 121 may select at least one of the memory blocks BLK1 to BLKz according to the decoded block address. The address decoder 121 may decode a row address RADD, among the received addresses ADDR. The address decoder 121 may select at least one word line WL of the selected memory block by applying voltages supplied from the voltage generator 122 to the at least one word line WL according to the decoded row address RADD.

During a program operation, the address decoder 121 may apply a program voltage to the selected word line and apply a pass voltage having a level lower than that of the program voltage to unselected word lines. During a program verify operation, the address decoder 121 may apply a verify voltage to the selected word line and apply a verify pass voltage having a level higher than that of the verify voltage to unselected word lines.

During a read operation, the address decoder 121 may apply a read voltage to the selected word line and apply a read pass voltage having a level higher than that of the read voltage to unselected word lines.

The erase operation of the memory device 100 is performed on a memory block basis. During the erase operation, the addresses ADDR input to the memory device 100 include a block address. The address decoder 121 may decode the block address and select one memory block according to the decoded block address. During the erase operation, the address decoder 121 may apply a ground voltage to word lines coupled to the selected memory block.

In accordance with an embodiment of the present disclosure, the address decoder 121 may decode a column address, among the received addresses ADDR. The decoded column address may be transferred to the page buffer group 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 may be used as an operating voltage for the memory device 100.

In an embodiment, the voltage generator 122 may generate various operating voltages Vop that are used for program, read, and erase operations in response to an operation signal OPSIG, The voltage generator 122 may generate the plurality of operating voltages Vop using the external supply voltage or the internal supply voltage. The voltage generator 122 may generate various voltages used by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage so as to generate a plurality of operating voltages Vop having various voltage levels, and may generate the plurality of operating voltages Vop by selectively enabling the plurality of pumping capacitors under the control of the control logic 130.

The generated operating voltages stop may be supplied to the memory cell array 110 by the address decoder 121.

The page buffer group 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm may transmit/receive data DATA to/from the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. The memory cells in the selected page are programmed based on the received data DATA. Memory cells coupled to a bit line to which a program-enable voltage (e.g., a ground voltage) is applied may have increased threshold voltages. The threshold voltages of memory cells coupled to a bit line to which a program-inhibit voltage (e.g., a supply voltage) is applied may be maintained, During a program verify operation, the first to m-th page buffers PB1 to PBm read the data DATA stored in the selected memory cells from the selected memory cells through the bit lines BL1 to BLm.

During a read operation, the page buffer group 123 may read data DATA from the memory cells in the selected page through the bit lines BL1 to BLm, and may store the read data DATA in the first to m-th page buffers PB1 to PBm.

During an erase operation, the page buffer group 123 may allow the bit lines BL1 to BLm to float. In an embodiment, the page buffer group 123 may include a column select circuit.

In an embodiment, while pieces of data stored in some of the plurality of page buffers included in the page buffer group 123 are being programmed to the memory cell array 110, the remaining page buffers may receive new data from the memory controller 200 and then store the new data.

The data input/output circuit 124 is coupled to the first to m-th page buffers PB1 to PBm through the data lines DL. The data input/output circuit 124 is operated in response to the control of the control logic 130.

The data input/output circuit 124 may include a plurality of input/output buffers (not illustrated) which receive input data DATA. During a program operation, the data input/output circuit 124 receives the data DATA to be stored from an external controller (not illustrated). During a read operation, the data input/output circuit 124 outputs the data DATA, received from the first to m-th page buffers PB1 to PBm included in the page buffer group 123, to the external controller.

During a read operation or a verify operation, the sensing circuit 125 may generate a reference current in response to an enable bit F, signal VRYBIT generated by the control logic 130, and may output a pass signal or a fail signal to the control logic 130 by comparing a sensing voltage VPB received from the page buffer group 123 with a reference voltage generated by the reference current.

The control logic 130 may be coupled to the address decoder 121, the voltage generator 122, the page buffer group 123, the data input/output circuit 124, and the sensing circuit 125. The control logic 130 may control the overall operation of the memory device 100. The control logic 130 may be operated in response to a command CMD transferred from an external device. The control logic 130 may be implemented as hardware, software, or a combination of hardware and software. For example, the control logic 130 may be a control logic circuit operating in accordance with an algorithm and/or a processor executing control logic code.

The control circuit 130 may control the peripheral circuit 120 by generating various types of signals in response to the command CMD and the addresses ADDR. For example, the control logic 130 may generate the operation signal OPSIG, the row address RADD, page buffer control signals PBSIGNALS, and the enable bit signal VRYBIT in response to the command CMD and the addresses ADDR. The control logic 130 may output the operation signal OPSIG to the voltage generator 122, may output the row address RADD to the address decoder 121, may output the page buffer control signal PBSIGNALS to the page buffer group 123, and may output the enable bit signal VRYBIT to the sensing circuit 125. In addition, the control logic 130 may determine whether a verify operation has passed or failed in response to the pass or fail signal PASS or FAIL output from the sensing circuit 125.

Figure 3:
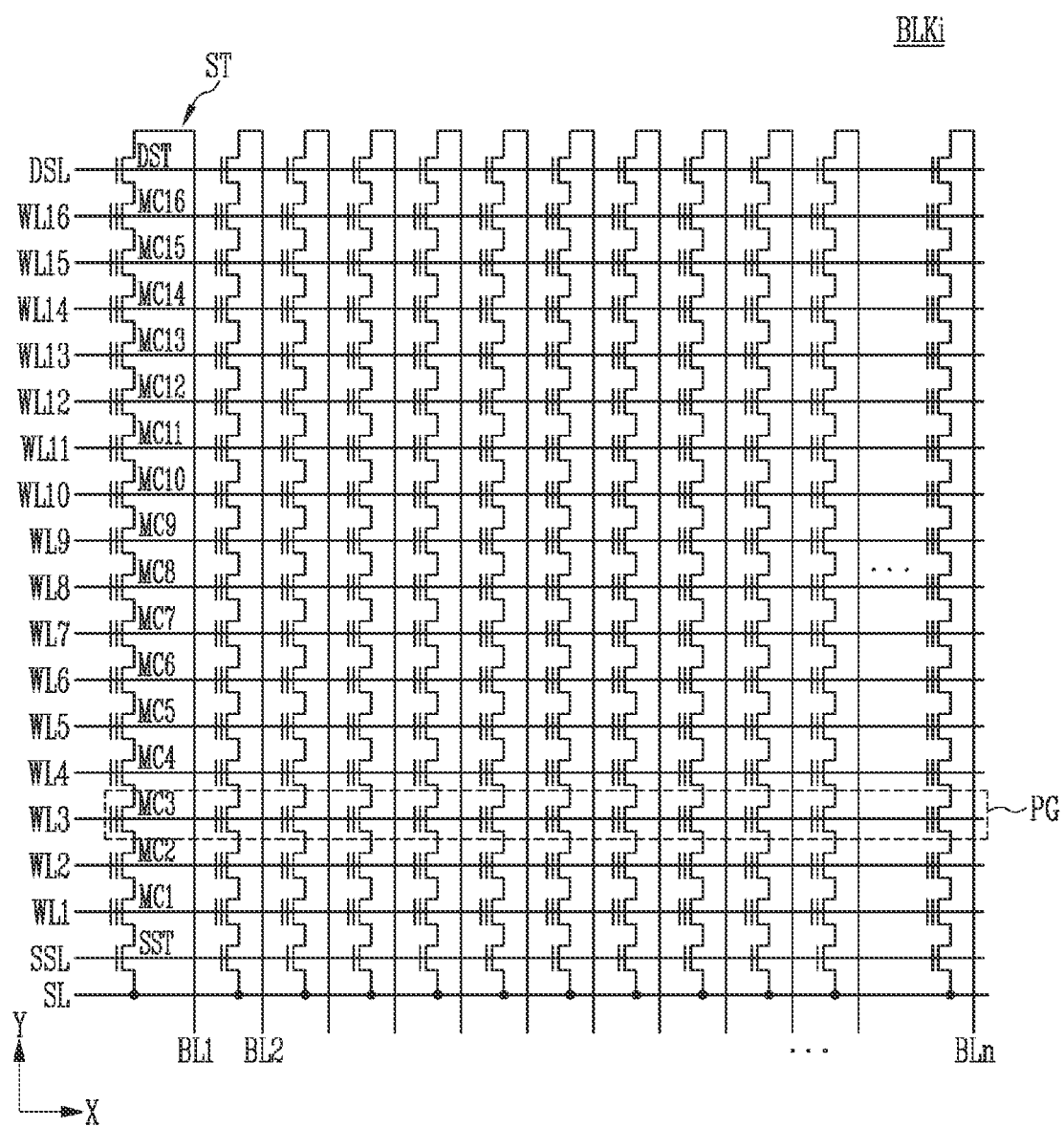
FIG. 3 is a diagram illustrating the structure of any one of a plurality of memory blocks BLK1 to BLKz of FIG. 2.

FIG. 3 is a diagram illustrating the structure of any one of the plurality of memory blocks BLK1 to BLKz of FIG. 2.

A memory block BLK1 indicates any one memory block, among the memory blocks BLK1 to BLKz of FIG. 2.

Referring to FIG. 3, a plurality of word lines arranged in parallel to each other may be coupled between a first select line and a second select line. Here, the first select line may be a source select line SSL, and the second select line may be a drain select line DSL. In detail, the memory block BLK1 may include a plurality of strings ST coupled between bit lines BL1 to BLn and a source line SL. The bit lines BL1 to BLn may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells MC1 to MC16, and a drain select transistor DST which are coupled in series to each other between the source line SL and the first bit line BL1. A single string ST may include at least one source select transistor SST and at least one drain select transistor DST, and may include more memory cells than the memory cells MC1 to MC16 illustrated in the drawing.

A source of the source select transistor SST may be coupled to the source line SL, and a drain of the drain select transistor DST may be coupled to the first bit line BL1. The memory cells MC1 to MC16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells MC1 to MC16 may be coupled to a plurality of word lines WL1 to WL16, respectively. A group of memory cells coupled to the same word line, among the memory cells included in different strings ST, may be referred to as a 'physical page (PG)'. Therefore, the memory block BLK1 may include a number of physical pages (PG) identical to the number of word lines WL1 to WL16.

One memory cell may store one bit of data. This cell is typically designated as a "single-level cell (SLC)", In this case, one physical page (PG) may store data corresponding to one logical page (LPG). The data corresponding to one logical page (LPG) may include a number of data bits identical to the number of cells included in one physical page (PG).

One memory cell may store two or more bits of data. In this case, one physical page (PG) may store data corresponding to two or more logical pages (LPG).

Figure 4:
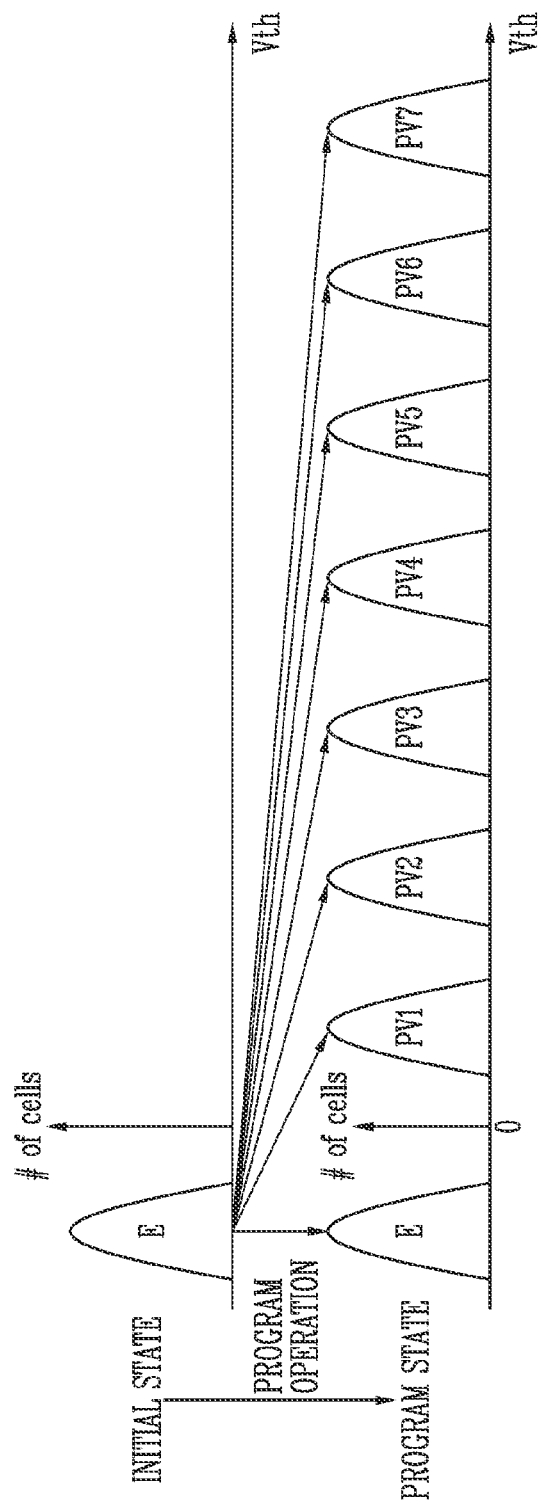
FIG. 4 is a diagram illustrating threshold voltage distributions of memory cells depending on a program operation of a memory device.

FIG. 4 is a diagram illustrating threshold voltage distributions of memory cells depending on a program operation of a memory device.

In FIG. 4, the horizontal axis of a graph indicates threshold voltages Vth of memory cells, and the vertical axis of the graph indicates the number of memory cells (# of cells).

Referring to FIG. 4, the threshold voltage distributions of memory cells may be changed from an initial state to a program state depending on the program operation.

In FIG. 4, a description is made on the assumption that data is programmed using a TLC scheme in which one memory cell stores three bits of data.

The initial state may be a state in which a program operation is not performed and in which the threshold voltage distributions of memory cells are in an erase state E.

Program states may be the threshold voltage distributions of memory cells on which a program operation is performed. Each of the memory cells on which the program operation is performed may have a threshold voltage corresponding to any one of a plurality of program states. For example, when data is programmed in a triple-level cell (TLC) scheme in which three bits of data are stored in one memory cell, the plurality of program states may indicate the erased state E and first to seventh program states PV1 to PV7. In an embodiment, each of the memory cells on which the program operation is performed may have a threshold voltage corresponding to the erased state E or any one of the first to seventh program states PV1 to PV7. The threshold voltage of each memory cell in the initial state may be increased to the threshold voltage corresponding to the erased state E or any one of the first to seventh program states PV1 to PV7 through the program operation.

Each memory cell may have the erased state E or any one of the program states PV1 to PV7 as a target program state. The target program state may be determined depending on the data to be stored in the corresponding memory cell. Each memory cell may have a threshold voltage corresponding to the target program state, among the program states, through the corresponding program operation.

Figure 5:
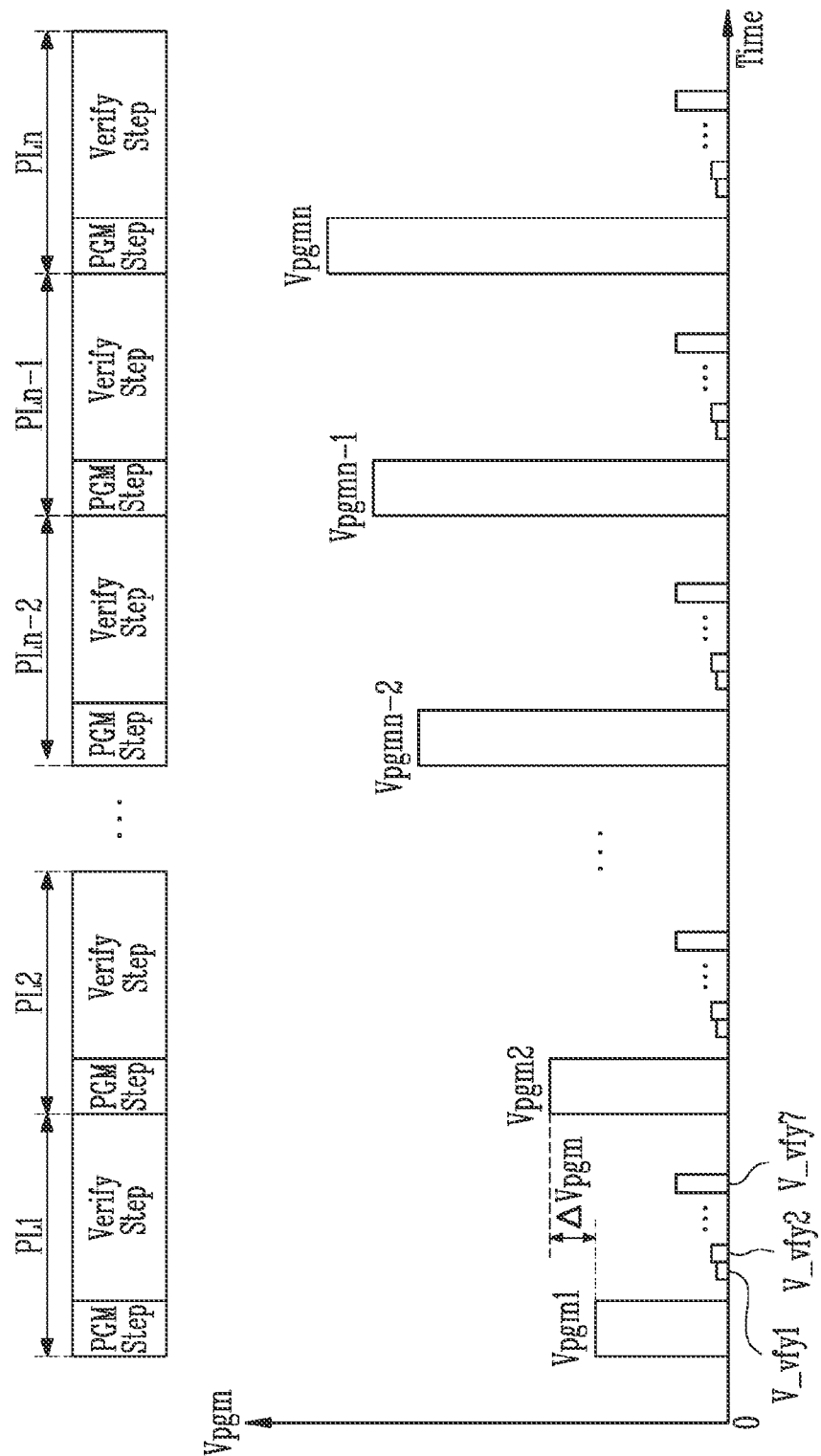
FIG. 5 is a diagram illustrating the program operation of a memory device.

FIG. 5 is a diagram illustrating the program operation of the memory device.

In FIG. 5, the horizontal axis of a graph indicates time and the vertical axis of the graph denotes the magnitude of program voltages Vpgm.

In FIG. 5, a description is made on the assumption that data is programmed using a TLC scheme in which one memory cell stores three bits of data.

Referring to FIG. 5, the program operation of the memory device 100 may include a plurality of program loops PL1 to PLn. The memory device 100 may perform a program operation so that each of selected memory cells has a threshold voltage corresponding to any one of a plurality of program states by performing the plurality of program loops PL1 to PLn.

Each of the plurality of program loops PL1 to PLn may include a program voltage apply step (PGM Step) and a verify step (Verify Step).

The program voltage apply step (PGM Step) may be the step of applying a program voltage to a selected word line coupled to the selected memory cells. For example, the memory device 100 may apply a first program voltage Vpgm1 to the selected word line coupled to selected memory cells in the first program loop PL1, After the first program voltage Vpgm1 is applied to the selected word line coupled to the selected memory cells, respective threshold voltages of the selected memory cells may be the threshold voltages corresponding to the target program state, among the plurality of program states.

The verify step may be the step of applying a verify voltage to the selected word line coupled to the selected memory cells. The verify step may be the step of determining whether respective threshold voltages of the selected memory cells are threshold voltages corresponding to the target program state, among the plurality of program states. The verify step may be the step of applying a verify voltage corresponding to the target program state of the selected memory cells. For example, when the selected memory cells are read as off-cells using verify voltages corresponding to respective target program states of the selected memory cells, the selected memory cells may pass the verify step.

In an embodiment, in the first program loop PL1, after the first program voltage Vpgm1 is applied to the selected word line coupled to the selected memory cells, first to seventh verify voltages V_vfy1 to V_vfy7 may be sequentially applied thereto. In this case, the first verify voltage V_vfy1 may be applied to memory cells having a first program state as the target program state, and thus the first verify step may be started. The second verify voltage V_vfy2 may be applied to memory cells having a second program state as the target program state, and thus the first verify step may be continued. The third verify voltage V_vfy3 may be applied to memory cells having a third program state as the target program state, and thus the first verify step may be continued. The fourth verify voltage V_vfy4 may be applied to memory cells having a fourth program state as the target program state, and thus the first verify step may be continued. The fifth verify voltage V_vfy5 may be applied to memory cells having a fifth program state as the target program state, and thus the first verify step may be continued. The sixth verify voltage V_vfy6 may be applied to memory cells having a sixth program state as the target program state, and thus the first verify step may be continued. The seventh verify voltage V_vfy7 may be applied to memory cells having a seventh program state as the target program state, and thus the first verify step may be completed. The number of verify voltages is not limited to the present embodiment.

It may be determined that the memory cells having passed the verify step using respective verify voltages V_vfy1 to V_vfy7 have threshold voltages corresponding to the target program states. The memory cells having passed the first verify step may be program-inhibited in the second program loop PL2, A program-inhibit voltage may be applied to bit lines coupled to the program-inhibited memory cells.

It may be determined that the memory cells having faded the verify step using respective verify voltages V_vfy1 to V_vfy7 do not have threshold voltages corresponding to the target program states. The memory cells having failed the first verify step may perform the second program loop PL2.

In the second program loop PL2, the memory device 100 may apply a second program voltage Vpgm2 higher than the first program voltage Vpgm1 by a unit voltage ΔVpgm to the selected word line coupled to the selected memory cells. Thereafter, the memory device 100 may perform the verify step of the second program loop PL2 in the same manner as the verify step of the first program loop PL1.

Then, the memory device 100 may perform a subsequent program loop in the same manner as the second program loop PL2 a preset number of times.

In an embodiment, when the program operation is not completed within a preset number of program loops, the program operation may fail. When the program operation is completed within a preset number of program loops, the program operation may pass. Whether the program operation is completed may be determined depending on whether all of the selected memory cells have passed the verify step. When all of the selected memory cells have passed the verify step, a subsequent program loop might not be performed.

In an embodiment, the program voltage may be determined based on an incremental step pulse programming (ISPP) method. The level of the program voltage may be increased or decreased in steps as the program loops PL1, to PLn are repeated. The number of applications of program voltages used in each program loop, the voltage levels of the program voltages, voltage application times, etc. may be determined in various ways under the control of the memory controller 200, FIG. 6 is a diagram illustrating a triple verify program (TPGM) operation of a memory device.

Figure 6:
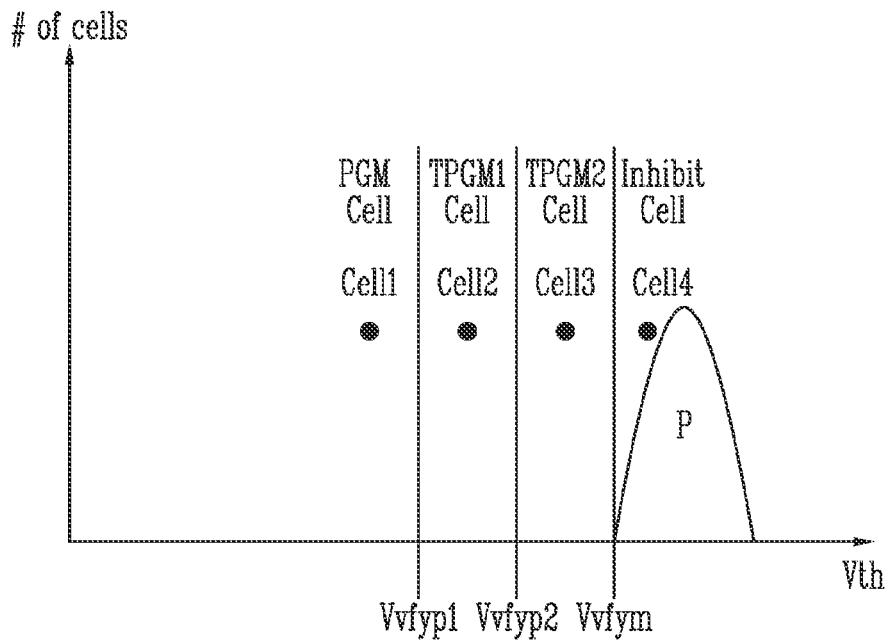
FIG. 6 is a diagram illustrating a TPGM operation of a memory device.

In FIG. 6, the horizontal axis of a graph indicates threshold voltages Vth of memory cells, and the vertical axis of the graph indicates the number of memory cells (# of cells).

Referring to FIG. 6, a triple verify program (TPGM) operation may be an operation of identifying threshold voltages of memory cells using at least three verify voltages at a verify step. In detail, the TPGM operation may be an operation of verifying whether the threshold voltages of memory cells have reached threshold voltages corresponding to a target program state using at least three verify voltages. The at least three verify voltages may include a first pre-verify voltage Vvfyp1, a second pre-verify voltage Vvfyp2, and a main verify voltage Vvfym.

The program state P illustrated in FIG. 6 may be any one of the first to seventh program states PV1 to PV7 illustrated in FIG. 4, Each of the verify voltages V_vfy1 to V_vfy7 illustrated in FIG. 5 may include a first pre-verify voltage Vvfyp1, a second pre-verify voltage Vvfyp2, and a main verify voltage Vvfym.

In an embodiment, the main verify voltage Vvfym may be a voltage higher than the second pre-verify voltage Vvfyp2, The second pre-verify voltage Vvfyp2 may be a voltage higher than the first pre-verify voltage Vvfyp1.

In an embodiment, the main verify voltage Vvfym may be a threshold voltage corresponding to the program state P. For example, the main verify voltage Vvfym may be any one of the verify voltages V_vfy1 to V_vfy7 illustrated in FIG. 5.

In an embodiment, threshold voltages of memory cells for which a program voltage apply step is terminated in any one of a plurality of program loops may be threshold voltages of a first cell to a fourth cell Cell1 to Cell4. At a verify step performed after the program voltage apply step, the memory device 100 may perform a TPGM operation for identifying the threshold voltages of the memory cells using the first pre-verify voltage Vvfyp1, the second pre-verify voltage Vvfyp2, and the main verify voltage Vvfym. At the verify step, the memory device 100 may perform a TPGM operation of verifying whether the threshold voltages of the memory cells have reached threshold voltages corresponding to a target program state using the first pre-verify voltage Vvfyp1, the second pre-verify voltage Vvfyp2, and the main verify voltage Vvfym.

In an embodiment, the first cell Cell1 may have a threshold voltage lower than or equal to the first pre-verify voltage Vvfyp1. The second cell Cell2 may have a threshold voltage that is higher than the first pre-verify voltage Vvfyp1 and lower than or equal to the second pre-verify voltage Vvfyp2. The third cell Cell3 may have a threshold voltage that is higher than the second pre-verify voltage Vvfyp2 and lower than or equal to the main verify voltage Vvfym. The fourth cell Cell4 may have a threshold voltage higher than the main verify voltage Vvfym.

In an embodiment, it is assumed that the target program state of the first to fourth cells Cell1 to Cell4 is the program state P illustrated in FIG. 6. That is, the threshold voltages of the first to fourth cells Cell1 to Cell4 may be increased to threshold voltages corresponding to the program state P.

The threshold voltage of the first cell Cell1 may need to be further increased to get to the threshold voltage corresponding to the program state P than the threshold voltages of the second to fourth cells Cell2 to Cell4. Here, the first cell Cell1 may be a program cell (PGM Cell). The threshold voltage of the second cell Cell2 may need to be further increased to get to the threshold voltage corresponding to the program state P than the threshold voltages of the third and fourth cells Cell3 and Cell4. Here, the second cell Cell2 may be a TPGM1 cell. The threshold voltage of the third cell Cell3 still needs to be further increased to get to the threshold voltage corresponding to the program state P, but less so than Cell1 and Cell2. Here, the third cell Cell3 may be a TPGM2 cell. Because the threshold voltage of the fourth cell Cell4 has the threshold voltage corresponding to the program state P, the threshold voltage is not increased any more. Here, the fourth cell Cell4 may be an inhibit cell.

Figure 7:
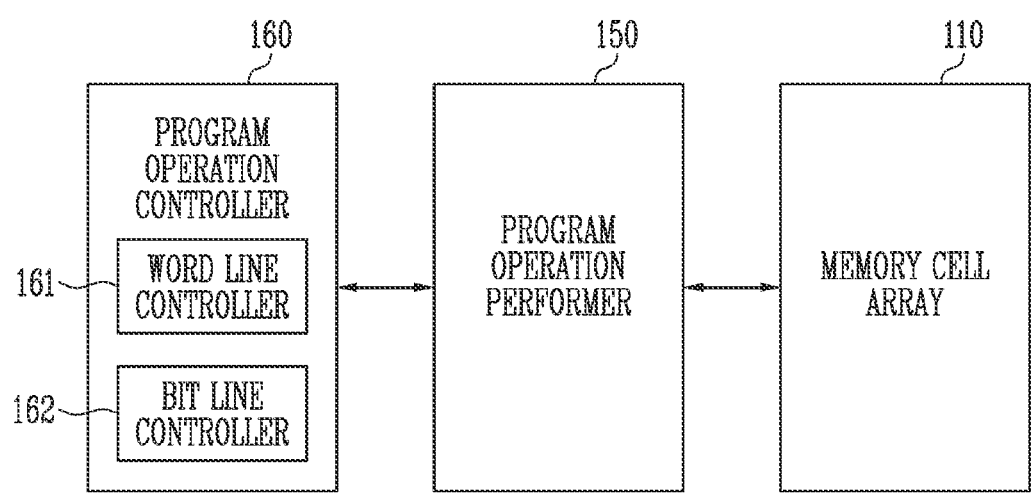
FIG. 7 is a diagram illustrating a program operation of a memory device according to an embodiment of the present disclosure.

FIG. 7 is a diagram illustrating a program operation of a memory device according to an embodiment of the present disclosure.

Referring to FIG. 7, the memory device 100 may include a program operation performer 150, a program operation controller 160, and a memory cell array 110. The memory cell array 110 may be configured and operated in the same manner as the memory cell array 110 illustrated in FIG. 2, The program operation controller 160 may be implemented as one component of the control logic 130 illustrated in FIG. 2. The program operation performer 150 may include the voltage generator 122, the address decoder 121, and the page buffer group 123 illustrated in FIG. 2, and may be operated by the components.

The program operation controller 160 may include a word line controller 161 and a bit line controller 162. The word line controller 161 may control the program operation performer 150 so that a program voltage is applied to a selected word line during a program operation. In an embodiment, the word line controller 161 may control the program operation performer 150 so that memory cells on which the program operation is to be performed are selected during a program operation. Thereafter, the word line controller 161 may control the program operation performer 150 so that the program voltage to be applied to the selected word line coupled to the selected memory cells and the pass voltage to be applied to an unselected word line are generated.

The bit line controller 162 may control the program operation performer 150 so that voltages to be applied to bit lines coupled to the memory cells are generated during a program operation. In an F, embodiment, the bit line controller 162 may control the program operation performer 150 so that the voltages to be applied to the bit lines respectively coupled to the memory cells are generated depending on the threshold voltages of the memory cells identified using the verify voltages Vvfyp1, Vvfyp2, and Vvfym illustrated in FIG. 6. For example, the bit line controller 162 may control the program operation performer 150 so that the voltage to be applied to a bit line coupled to a program cell PGM Cell, the voltage to be applied to a bit line coupled to a TPGM1 cell, the voltage to be applied to a bit line coupled to a TPGM2 cell, and the voltage to be applied to a bit line coupled to an inhibit cell are respectively generated.

The program operation performer 150 may perform a program operation on a plurality of memory cells included in the memory cell array 110 under the control of the program operation controller 160. In an embodiment, the program operation performer 150 may apply the generated program voltage to the selected word line coupled to the selected memory cells, among the plurality of memory cells, under the control of the program operation controller 160 during the program operation. The program operation performer 150 may apply the generated pass voltage to the unselected word line under the control of the program operation controller 160.

In other embodiments, the program operation performer 150 may apply the generated bit line voltages to respective bit lines coupled to the memory cells under the control of the program operation controller 160 during the program operation. For example, the program operation performer 150 may apply bit line voltages to respective bit lines coupled to the program cell (PGM Cell), the TPGM1 cell, the TPGM2 Cell, and the inhibit cell during the program operation.

Figure 8:
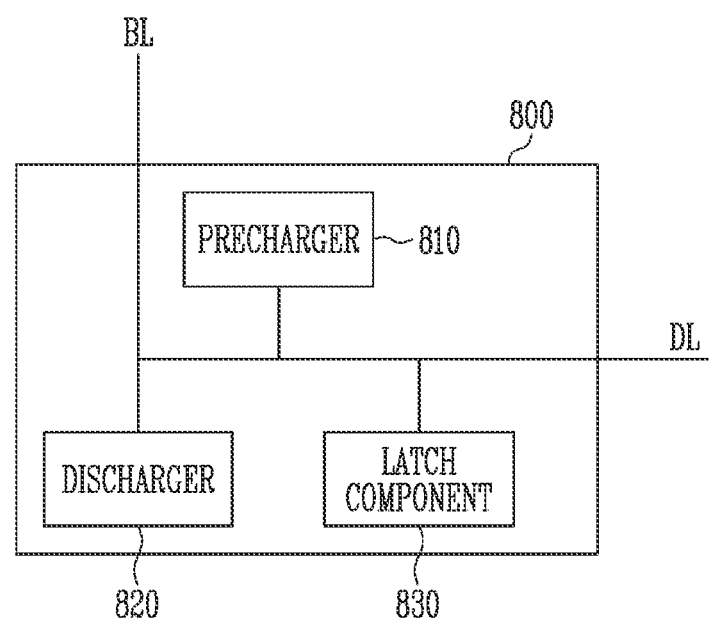
FIG. 8 is a diagram illustrating the operation of a page buffer circuit according to an embodiment of the present disclosure.

FIG. 8 is a diagram illustrating the operation of a page buffer circuit according to an embodiment of the present disclosure.

A page buffer circuit 800 illustrated in FIG. 8 may be any one page buffer PBi, among page buffers included in the page buffer group 123 illustrated in FIG. 2.

Referring to FIG. 8, the page buffer circuit 800 may include a precharger 810, a discharger 820, and a latch component 830. The precharger 810, the discharger 820, and the latch component 830 may be coupled between a bit line BL and a data line DL. The bit line BL may be coupled to a memory cell.

The precharger 810 may precharge the voltage of the bit line BL, In an embodiment, when the memory cell coupled to the bit line BL is a TPGM1 cell, the precharger 810 may apply a first precharge voltage to the bit line BL. The first precharge voltage may be a voltage higher than a ground voltage. When the memory cell coupled to the bit line BL is a TPGM2 cell, the precharger 810 may apply a second precharge voltage higher than the first precharge voltage to the bit line BL. When the memory cell coupled to the bit line BL is an inhibit cell, the precharger 810 may apply a program-inhibit voltage higher than the second precharge voltage to the bit line BL. The program-inhibit voltage may be a supply voltage.

The discharger 820 may precharge the voltage of the bit line BL to a ground voltage. In an embodiment, when the memory cell coupled to the bit line BL is a program cell (PGM cell), the discharger 820 may apply the ground voltage to the bit line BL.

The latch component 830 may store the result of identifying the threshold voltage of the memory cell using verify voltages by sensing the potential of the bit line BL.

Figure 9:
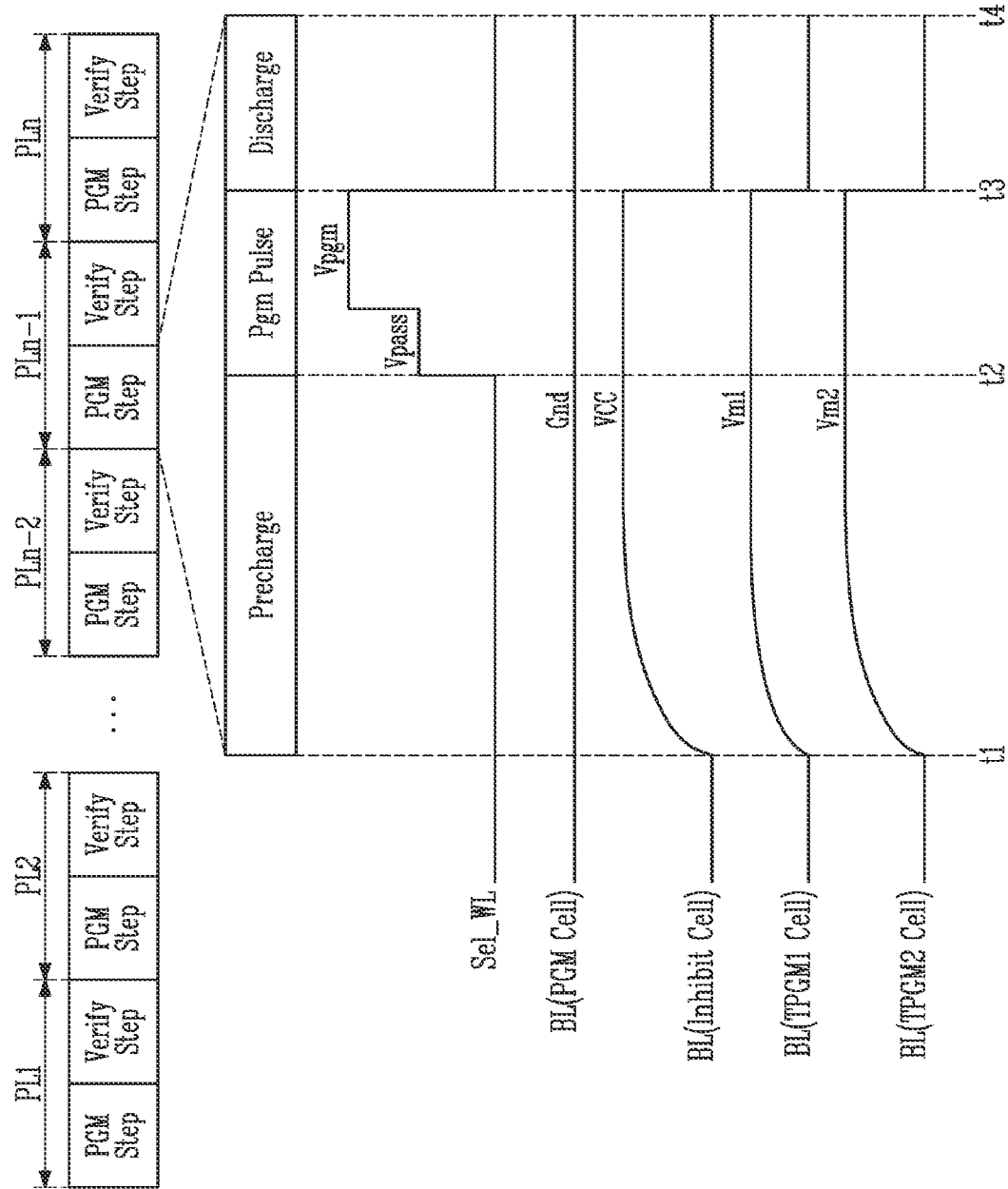
FIG. 9 is a diagram illustrating a program voltage apply step in the program operation of a memory device.

FIG. 9 is a diagram illustrating a program voltage apply step in the program operation of a memory device.

Referring to FIG. 9, the program operation of the memory device 100 may include a plurality of program loops PL1 to PLn. Each of the plurality of program loops PL1 to PLn may include a program voltage apply step (PGM Step) and a verify step (Verify Step).

The program voltage apply step (PGM Step) included in each of the plurality of program loops PL1 to PLn may include a precharge period, a program pulse (Pgm Pulse) period, and a discharge period.

A period from t1 to t2 may be the precharge period. The precharge period may be a period during which the bit line BL is precharged. In an embodiment, the memory device 100 may apply a ground voltage Gnd to a bit line BL(PGM Cell) coupled to a program cell during the precharge period. The memory device 100 may apply a program-inhibit voltage VCC to a bit line BL(Inhibit Cell) coupled to an inhibit cell during the precharge period. The memory device 100 may apply a first precharge voltage Vm1 to a bit line BL(TPGM1 Cell) coupled to a TPGM1 cell during the precharge period. The memory device 100 may apply a second precharge voltage Vm2 to a bit line BL(TPGM2 Cell) coupled to a TPGM2 cell during the precharge period.

A period from t2 to t3 may be a program pulse period (Pgm Pulse). The program voltages Vpgm1 to Vpgmn illustrated in FIG. 5 may be applied to a selected word line Sel_WL coupled to selected memory cells during the program pulse period (Pgm Pulse). The program pulse (Pgm Pulse) period may be a period during which data is stored in the selected memory cells. For example, during the program pulse period (Pgm Pulse), the memory device 100 may apply a pass voltage Vpass to the selected word line Sel_WL coupled to the selected memory cells for a predetermined period of time, and thereafter apply a program voltage Vpgm to the selected word line Sel_WL. The memory device 100 may maintain the voltage of the bit line BL(PGM Cell) coupled to the program cell at the ground voltage Gnd during the program pulse period (Pgm Pulse). The memory device 100 may maintain the voltage of the bit line BL (Inhibit Cell) coupled to the inhibit cell at the program-inhibit voltage VCC during the program pulse period (Pgm Pulse), The memory device 100 may maintain the voltage of the bit line BL(TPGM1 Cell) coupled to the TPGM1 cell at the first precharge voltage Vm1 during the program pulse period (Pgm Pulse), The memory device 100 may maintain the voltage of the bit line BL(TPGM2 Cell) coupled to the TPGM2 cell at the second precharge voltage Vm2 during the program pulse (Pgm Pulse) period.

A period from t3 to t4 may be the discharge period. The memory device 100 may apply the ground voltage Gnd to the selected word line Sel_WL during the discharge period. The memory device 100 may apply the ground voltage Gnd to the bit line BL(PGM Cell) coupled to the program cell, the bit line BL(Inhibit Cell) coupled to the inhibit cell, the bit line BL(TPGM1 Cell) coupled to the TPGM1 cell, and the bit line BL(TPGM2 Cell) coupled to the TPGM2 cell during the discharge period.

Figure 10:
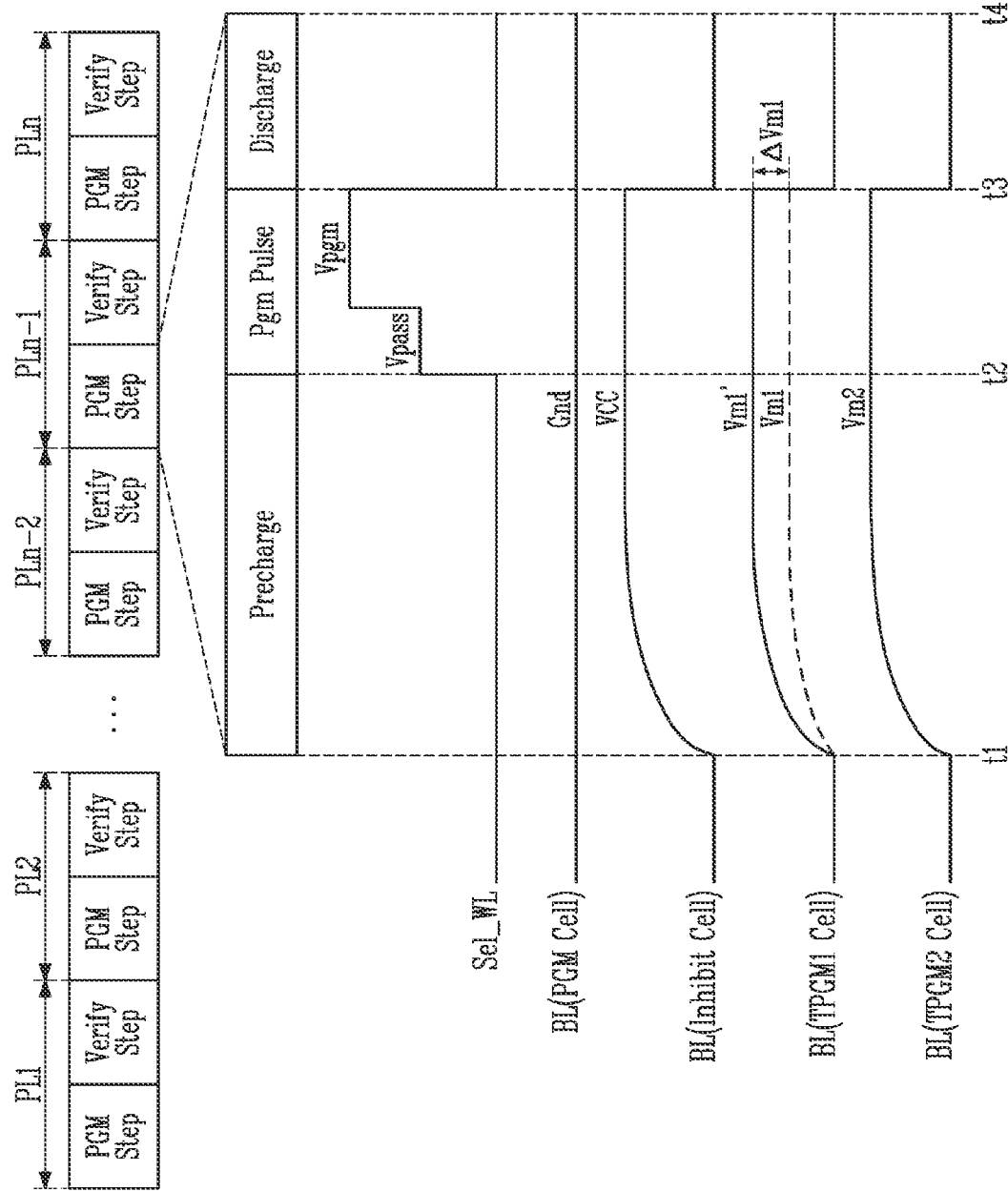
FIG. 10 is a diagram illustrating a coupling phenomenon between adjacent bit lines occurring in a program operation of a memory device.

FIG. 10 is a diagram illustrating a coupling phenomenon between adjacent bit lines occurring in a program operation of a memory device.

FIG. 10 is a diagram for additionally describing the case where the bit line BL(TPGM1 Cell) coupled to the TPGM1 cell and the bit line BL(TPGM2 Cell) coupled to the TPGM2 cell are adjacent to each other during the precharge period of the program voltage apply step (PGM Step) described above with reference to FIG. 9, Therefore, in FIG. 10, descriptions of the same components as those of FIG. 9 will be omitted.

Referring to FIG. 10, a period from t1 to t2 may be a precharge period. The memory device 100 may apply a first precharge voltage Vm1 to a bit line BL(TPGM1 Cell) coupled to a TPGM1 cell during the precharge period. The memory device 100 may apply a second precharge voltage Vm2 to a bit line BL(TPGM2 Cell) coupled to a TPGM2 cell during the precharge period.

In this case, in the case where a bit line closest to the bit line BL(TPGM1 Cell) coupled to the TPGM1 cell is the bit line BL(TPGM2 Cell) coupled to the TPGM2 cell, a coupling phenomenon attributable to parasitic capacitance between the bit lines may occur, During the precharge period, the voltage of the bit line BL(TPGM1 Cell) coupled to the TPGM1 cell may be increased to a third precharge voltage Vm1' higher than the first precharge voltage Vm1 due to the second precharge voltage Vm2 applied to the bit line BL(TPGM2 Cell) coupled to the TPGM2 cell. That is, because the voltage of the bit line BL(TPGM1 Cell) coupled to the TPGM1 cell increases due to the coupling phenomenon, the TPGM1 cell may have a threshold voltage lower than a threshold voltage corresponding to the target program state during a program operation.

Figure 11:
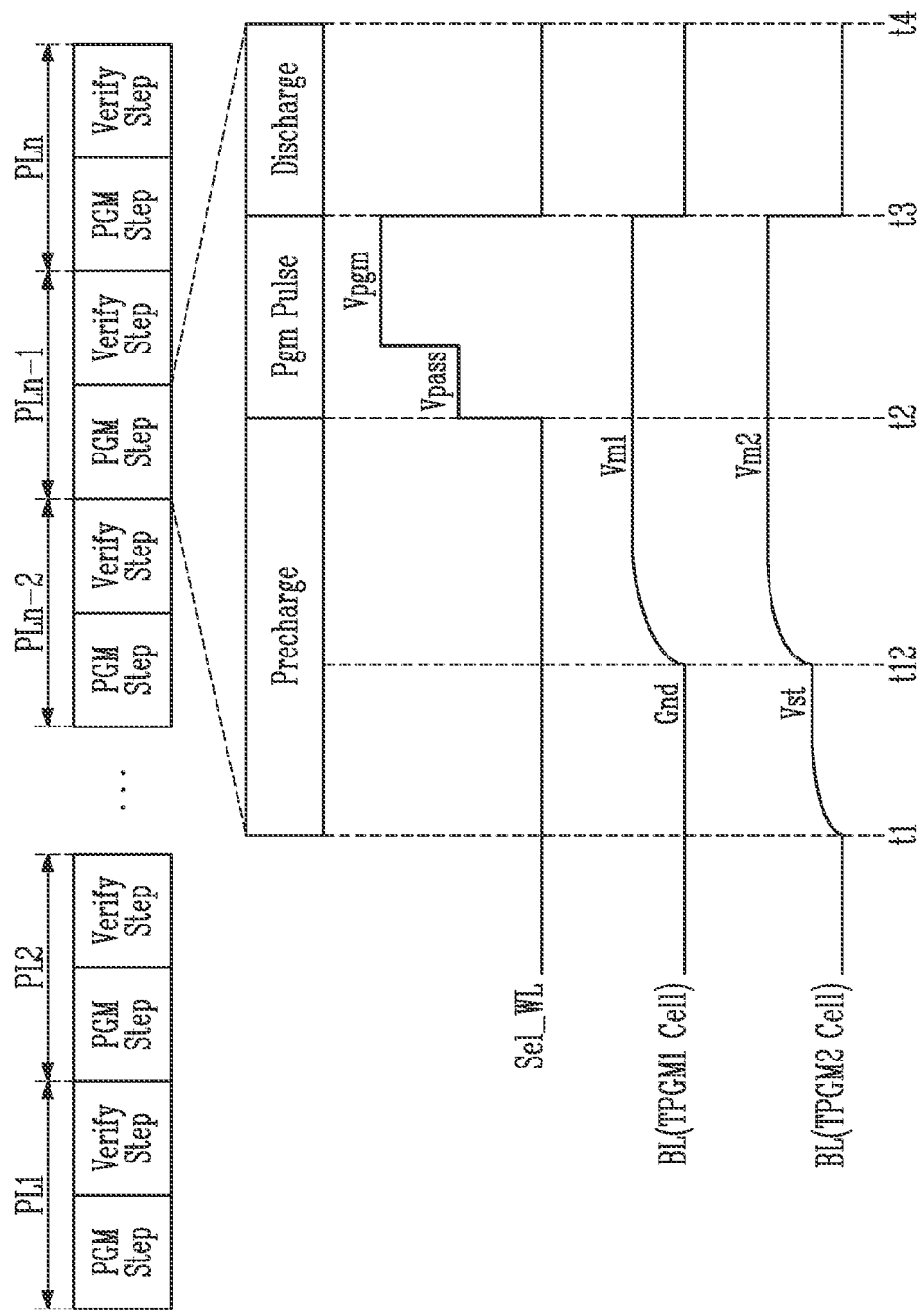
FIG. 11 is a diagram illustrating a program voltage apply step in a program operation of a memory device according to an embodiment of the present disclosure.

FIG. 11 is a diagram illustrating a program voltage apply step in a program operation of a memory device according to an embodiment of the present disclosure.

In FIG. 11, descriptions of the sane components as those of FIGS. 9 and 10 will be omitted.

Referring to FIG. 11, the program operation of the memory device 100 may include a plurality of program loops PL1 to PLn. Each of the plurality of program loops PL1 to PLn may include a program voltage apply step (PGM Step) and a verify step (Verify Step).

The program voltage apply step (PGM Step) included in each of the plurality of program loops PL1 to PLn may include a precharge period, a program pulse (Pgm Pulse) period, and a discharge period.

A period from t1 to t2 may be the precharge period. The precharge period may be a period during which the bit line BL is precharged.

The memory device 100 may apply a fourth precharge voltage Vst to the bit line BL(TPGM2 Cell) coupled to the TPGM2 cell during a period from t1 to t12, The fourth precharge voltage Vst may be a voltage that is a difference between the second precharge voltage Vm2 and the first precharge voltage Vm1. The memory device 100 may apply a fifth precharge voltage Gnd lower than the fourth precharge voltage Vst to the bit line BL(TPGM1 Cell) coupled to the TPGM1 cell during the period from t1 to t12, The fifth precharge voltage Gnd may be the ground voltage.

The memory device 100 may apply the first precharge voltage Vm1 to the bit line BL(TPGM1 Cell) coupled to the TPGM1 cell during a period from t12 to t2. The memory device 100 may apply the second precharge voltage Vm2 to the bit line BL(TPGM2 Cell) coupled to the TPGM2 cell during the period from t12 to t2. The second precharge voltage Vm2 may be a voltage higher than the first precharge voltage Vm1. In an embodiment, the difference between the magnitude of the first precharge voltage Vm1 and the magnitude of the fifth precharge voltage Gnd may be equal to the difference between the magnitude of the second precharge voltage Vm2 and the magnitude of the fourth precharge voltage Vst. For example, a range in which the voltage of the bit line BL(TPGM1 Cell) coupled to the TPGM1 cell increases from the magnitude of the fifth precharge voltage Gnd to the magnitude of the first precharge voltage Vm1 may be equal to a range in which the voltage of the bit line BL(TPGM2 Cell) coupled to the TPGM2 cell increases from the magnitude of the fourth precharge voltage Vst to the magnitude of the second precharge voltage Vm2.

In the present disclosure, after the fourth precharge voltage Vst is first applied to the bit line BL(TPGM2 Cell) coupled to the TPGM2 cell, the second precharge voltage Vm2 is applied thereto, and thus a coupling phenomenon between the bit line BL(TPGM1 Cell) coupled to the TPGM1 cell and the bit line BL(TPGM2 Cell) coupled to the TPGM2 cell may be mitigated or prevented.

Figure 12:
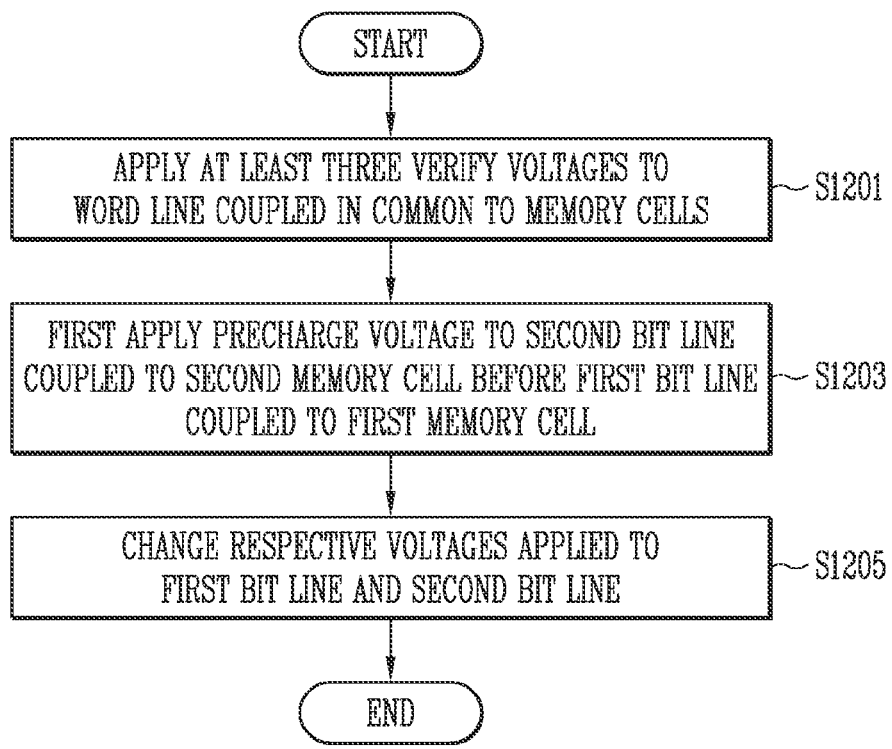
FIG. 12 is a flowchart illustrating the program operation of a memory device according to an embodiment of the present disclosure.

FIG. 12 is a flowchart illustrating the program operation of the memory device according to an embodiment of the present disclosure.

Referring to FIG. 12, at step S1201, the memory device 100 may apply at least three verify voltages to a word line coupled in common to memory cells. In an embodiment, the memory device 100 may identify threshold voltages of memory cells using the at least three verify voltages. For example, each of the memory cells may be identified as any one of a program cell (PGM cell), a TPGM1 cell, a TPGM2 cell, and an inhibit cell using the at least three verify voltages.

At step S1203, the memory device 100 may apply a precharge voltage first to a second bit line coupled to a second memory cell before applying a precharge voltage to a first bit line coupled to a first memory cell during a precharge period included in a program voltage apply step. In an embodiment, the first memory cell may be a TPGM1 cell. The second memory cell may be a TPGM2 cell. Thereafter, the voltage applied to the first bit line may be a voltage lower than the precharge voltage first applied to the second bit line. For example, the voltage applied to the first bit line may be a ground voltage.

At step S1205, the memory device 100 may change respective voltages applied to the first bit line and the second bit line. In an embodiment, the voltage applied to the second bit line may be higher than the voltage applied to the first bit line.

Figure 13:
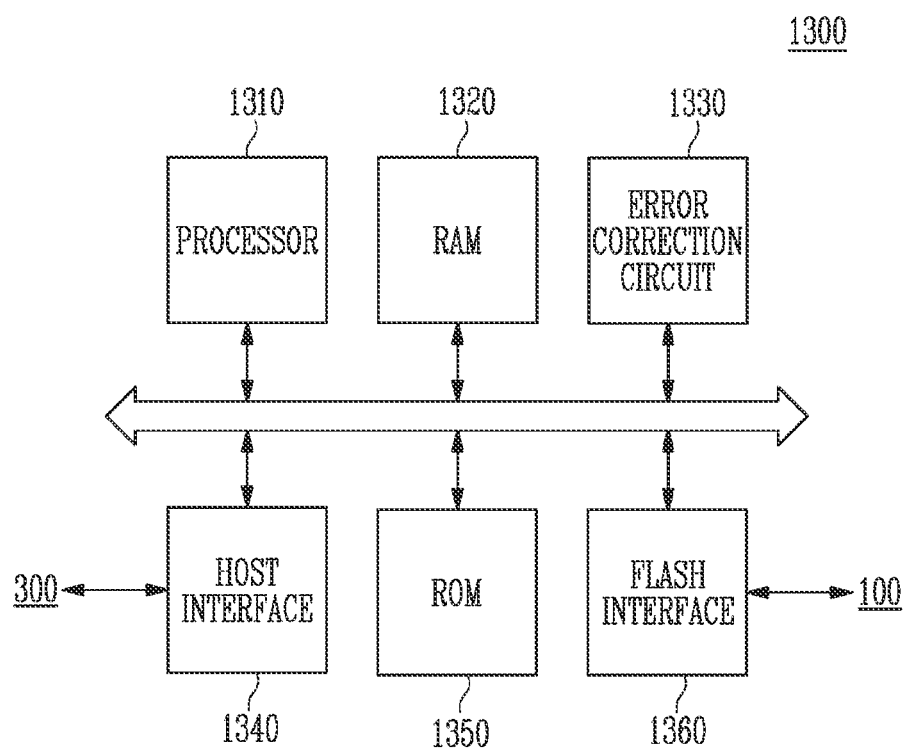
FIG. 13 is a diagram illustrating a memory controller of FIG. 1.

FIG. 13 is a diagram illustrating the memory controller of FIG. 1.

The memory controller 1300 of FIG. 13 may be the memory controller 200 of FIG. 1.

Referring to FIG. 13, the memory controller 1300 may include a processor 1310, RAM 1320, an error correction circuit 1330, a host interface 1340, ROM 1350, and a flash interface 1360.

The processor 1310 may control the overall operation of the memory controller 1300. The RAM 1320 may be used as a buffer memory, a cache memory or a working memory of the memory controller 1300.

The error correction circuit 1330 may perform error correction. The error correction circuit 1330 may perform error correction code (ECC) encoding based on data to be written to the memory device 100 through the flash interface 1360. The ECC-encoded data may be transferred to the memory device 100 through the flash interface 1360. The error correction circuit 1330 may perform error correction decoding (ECC decoding) on data received from the memory device 100 through the flash interface 1360. In an embodiment, the error correction circuit 1330 may be included, as a component of the flash interface 1360, in the flash interface 1360.

The ROM 1350 may store various types of information used for the operation of the memory controller 1300 in the form of firmware.

The memory controller 1300 may communicate with an external device (e.g., a host 300, an application processor, or the like) through the host interface 1340.

The memory controller 1300 may communicate with the memory device 100 through the flash interface 1360. The memory controller 1300 may transmit a command, an address, a control signal, etc. to the memory device 100 and receive data from the memory device 100, through the flash interface 1360. In an example, the flash interface 1360 may include a NAND interface.

Figure 14:
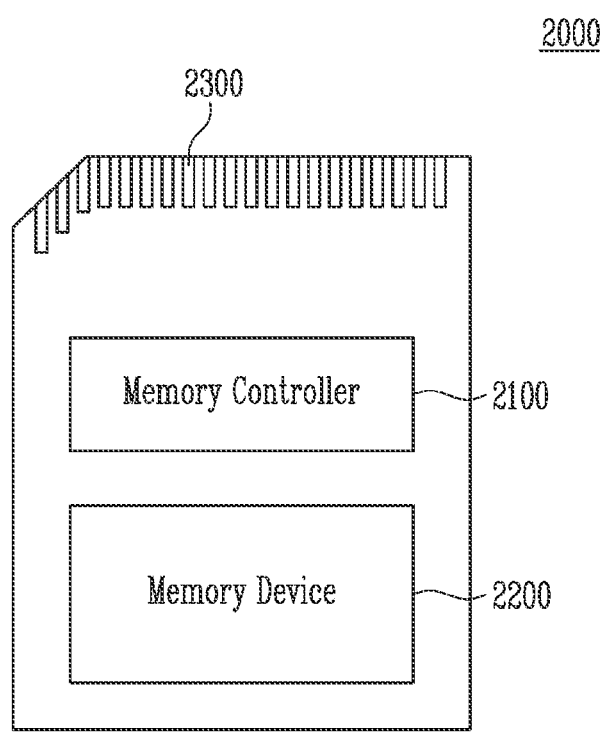
FIG. 14 is a block diagram illustrating a memory card system to which a memory system according to an embodiment of the present disclosure is applied.

FIG. 14 is a block diagram illustrating a memory card system to which a memory system according to an embodiment of the present disclosure is applied.

Referring to FIG. 14, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same manner as the memory controller 200, described above with reference to FIG. 1. The memory device 2200 may be implemented in the same manner as the memory device 100, described above with reference to FIG. 1.

In an embodiment, the memory controller 2100 may include components, such as RAM, a processor, a host interface, a memory interface, and an error correction circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (DATA), small computer system interface (SCSI), enhanced small disk interface (ESDI), integrated drive electronics (IDE), Firewire, universal flash storage (UFS), Wi-H, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices using, for example, Electrically Erasable and Programmable ROM (EEPROM), NAND flash memory, NOR flash memory, Phase-change RAM (PRAM), Resistive RAM (Re-RAM), Ferroelectric RAM (FRAM), or Spin Transfer Torque magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 15:
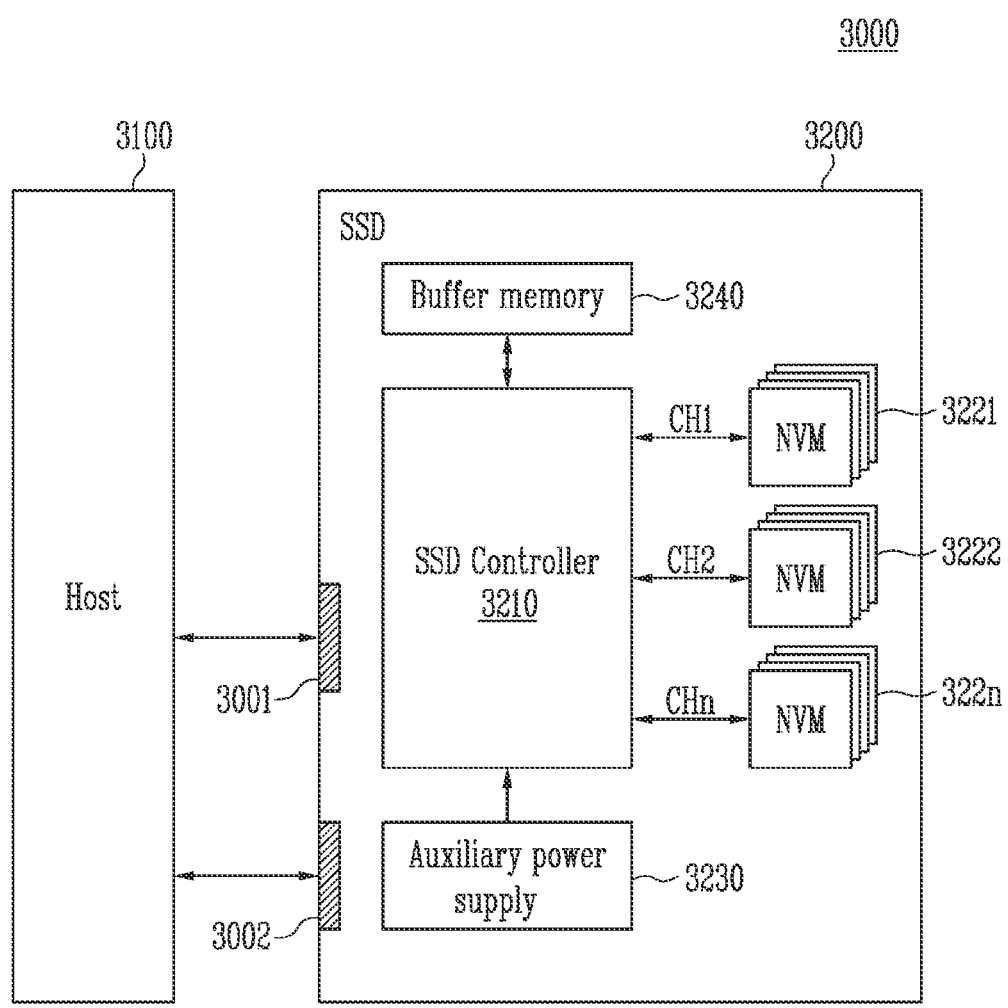
FIG. 15 is a block diagram illustrating a solid state drive (SSD) system to which a memory system according to an embodiment of the present disclosure is applied.

FIG. 15 is a block diagram illustrating a solid state drive (SSD) system to which a memory system according to an embodiment of the present disclosure is applied.

Referring to FIG. 15, an SSD system 3000 may include a host 3100 and an SSD 3200. The SSD 3200 may exchange signals with the host 3100 through a signal connector 3001 and may receive power through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may perform the function of the memory controller 200 described above with reference to FIG. 1.

The SSD controller 3210 may control the plurality of flash memories 3221 to 322n in response to the signals received from the host 3100. In an embodiment, the signals may be signals based on the interfaces of the host 3100 and the SSD 3200. For example, the signals may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (DATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power from the host 3100 and may be charged. The auxiliary power supply 3230 may supply the power of the SSD 3200 when the supply of power from the host 3100 is not being smoothly received. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 16:
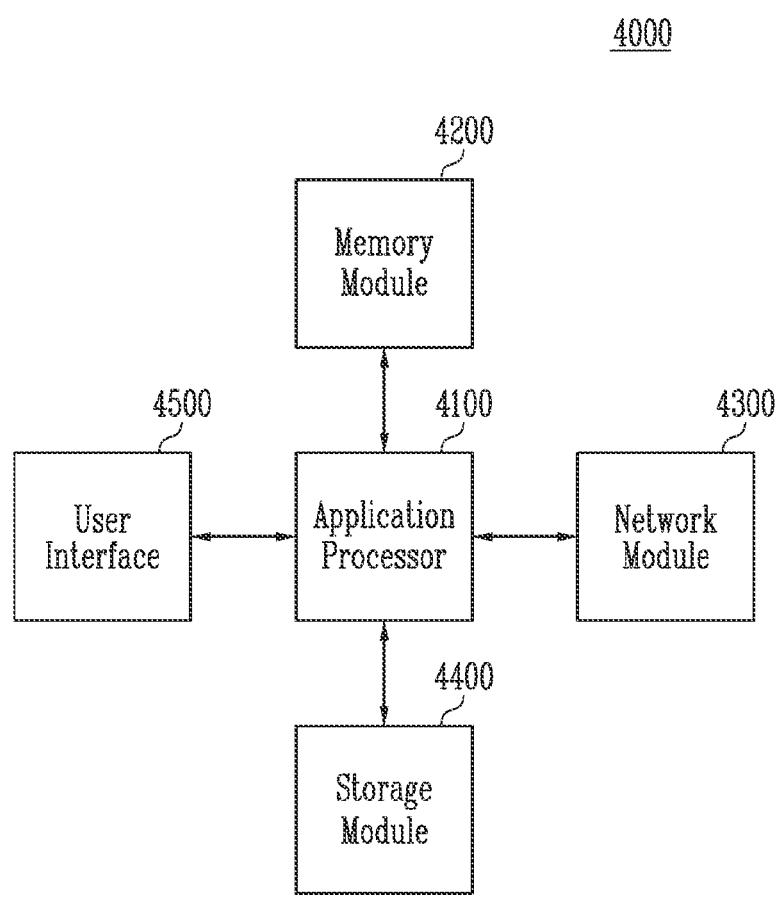
FIG. 16 is a block diagram illustrating a user system to which a memory system according to an embodiment of the present disclosure is applied.

FIG. 16 is a block diagram illustrating a user system to which a memory system according to an embodiment of the present disclosure is applied.

Referring to FIG. 16, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000, The application processor 4100 may be provided as a system-on-chip (SoC).

The memory module 4200 may function as main memory, working memory, buffer memory or cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device using, for example Phase-change RAM (PRAM), Magnetic RAM (MRAM), Resistive RAM (RRAM), NAND flash memory, NOR flash memory, or NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same manner as the memory device 100 described above with reference to FIG. 1. The storage module 4400 may be operated in the same manner as the memory system 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device. an Active Matrix OLED (AMOLED) display device, an LED, a speaker, and a monitor.

In accordance with an embodiment of the present disclosure, there are provided a memory device that is capable of mitigating or preventing a coupling phenomenon between adjacent bit lines that occurs in a program operation, and to a method of operating the memory device.

What is claimed is:
1. A memory device, comprising:
memory cells;
a program operation performer configured to perform a verify operation and a program voltage apply operation, wherein the verify operation is performed to verify whether threshold voltages of the memory cells have reached threshold voltages corresponding to a target program state using a first verify voltage, a second verify voltage higher than the first verify voltage, and a third verify voltage higher than the second verify voltage, and wherein the program voltage apply operation is performed to apply a program voltage to a word line coupled in common to the memory cells based on a result of the verify operation; and
a program operation controller configured to control the program operation performer such that, during the program voltage apply operation, a precharge voltage is first applied to a second bit line coupled to a second memory cell having a threshold voltage that is higher than the second verify voltage and lower than or equal to a third verify voltage, among the memory cells, before a precharge voltage is applied to a first bit line coupled to a first memory cell having a threshold voltage that is higher than the first verify voltage and lower than or equal to the second verify voltage, among the memory cells.
2. The memory device according to claim 1, wherein the program operation controller is configured to control the program operation performer such that voltages applied to the first bit line and the second bit line during a first period and voltages applied to the first bit line and the second bit line during a second period following the first period are respectively changed.

3. The memory device according to claim 2, wherein the program operation controller is configured to control the program operation performer such that a voltage lower than the voltage applied to the second bit line during the first period is applied to the first bit line during the first period.

4. The memory device according to claim 3, wherein the voltage lower than the voltage applied to the second bit line during the first period is a ground voltage.

5. The memory device according to claim 2, wherein the voltage applied to the second bit line during the first period is a difference between the voltage applied to the second bit line during the second period and the voltage applied to the first bit line during the second period.

6. The memory device according to claim 2, wherein the voltage applied to the first bit line during the second period is a voltage that is lower than the voltage applied to the second bit line during the second period and higher than a ground voltage.

7. The memory device according to claim 2, wherein the program operation controller is configured to control the program operation performer such that the program voltage is applied to the word line after the first period and the second period are terminated.

8. The memory device according to claim 1, wherein the second bit line is a bit line closest to the first bit line.

9. The memory device according to claim 1, wherein the third verify voltage is a threshold voltage corresponding to the target program state of the memory cells.

10. The memory device according to claim 2, wherein a difference between a magnitude of the voltage applied to the first bit line during the second period and a magnitude of the voltage applied to the first bit line during the first period is equal to a difference between a magnitude of the voltage applied to the second bit line during the second period and a magnitude of the voltage applied to the second bit line during the first period.

11. A method of operating a memory device, the memory device performing a program operation of storing data in memory cells, the method comprising:
applying at least three verify voltages to a word line coupled in common to the memory cells;
applying a precharge voltage to bit lines respectively coupled to the memory cells at different time points depending on threshold voltages of the memory cells identified using the at least three verify voltages; and
applying a program voltage to the word line after the precharge voltage is applied.

12. The method according to claim 11, wherein applying the precharge voltage to the bit lines before applying the program voltage to the word line comprises:
applying the precharge voltage to a second bit line coupled to a second memory cell before applying the precharge voltage to a first bit line coupled to a first memory cell, among the memory cells; and
changing voltages applied to the first bit line and to the second bit line, respectively.

13. The method according to claim 12, wherein the first memory cell has a threshold voltage between the two highest verify voltages among the at least three verify voltages.

14. The method according to claim 13, wherein the second memory cell has a threshold voltage between the third-highest verify voltage and the second-highest verify voltage among the at least three verify voltages.

15. The method according to claim 14, wherein the second memory cell is a memory cell closest to the first memory cell.

16. The method according to claim 12, wherein applying the precharge voltage to the second bit line before applying the precharge voltage to the first bit line comprises:
applying a voltage lower than the voltage applied to the second bit line to the first bit line while applying the precharge voltage to the second bit line.

17. The method according to claim 16, wherein the voltage lower than the voltage applied to the second bit line is a ground voltage.

18. The method according to claim 12, wherein in changing the voltages applied to the first bit line and to the second bit line, respectively, the voltage applied to the first bit line is lower than the voltage applied to the second bit line.

19. The method according to claim 12, wherein the magnitude of the precharge voltage first applied to the second bit line is a difference between a magnitude of the voltage applied to the second bit line and a magnitude of the voltage applied to the first bit line in changing the voltages applied to the first bit line and to the second bit line, respectively.

20. The method according to claim 11, wherein a highest verify voltage, among the at least three verify voltages, is a threshold voltage corresponding to a target program state of the memory cells.

* * * * *